(12) United States Patent
Sciacca et al.

(10) Patent No.: US 6,392,331 B1
(45) Date of Patent: May 21, 2002

(54) BISTABLE ACTUATOR

(75) Inventors: Aldo Sciacca, San Donato Milanese; Pietro Mandurino, Bologna; Donato Colonna, Milan; Franco Moriconi, San Donato Milanese, all of (IT)

(73) Assignee: ABB Ricerca SpA, Sesto San Giovanni (IT)

( * ) Notice: Subject to any disclaimer, the term of this patent is extended or adjusted under 35 U.S.C. 154(b) by 0 days.

(21) Appl. No.: 09/471,085

(22) Filed: Dec. 23, 1999

(30) Foreign Application Priority Data

Dec. 24, 1998 (IT) .......................... MI98A2829

(51) Int. Cl.$^7$ .......................................... H01L 41/053
(52) U.S. Cl. ...................................... 310/348; 310/367
(58) Field of Search ................... 310/348, 367, 310/330, 331

(56) References Cited

U.S. PATENT DOCUMENTS

| | | | | |
|---|---|---|---|---|
| 3,093,760 A | * | 6/1963 | Tarasevich | 310/348 |
| 4,383,195 A | | 5/1983 | Kolm et al. | 310/330 |
| 4,399,385 A | * | 8/1983 | Osaka et al. | 310/328 |
| 4,431,934 A | * | 2/1984 | Kleinschmidt et al. | 310/331 |
| 4,939,405 A | * | 7/1990 | Okuyama et al. | 310/330 |
| 5,422,532 A | * | 6/1995 | Inoue et al. | 310/326 |
| 5,548,180 A | * | 8/1996 | Kaida | 310/367 |
| 5,736,911 A | * | 4/1998 | Watanabe | 310/312 |
| 5,779,218 A | * | 7/1998 | Kowanz | 251/129.66 |
| 5,781,646 A | * | 7/1998 | Face | 310/367 |

FOREIGN PATENT DOCUMENTS

| | | | |
|---|---|---|---|
| DE | 548 731 A2 | 12/1992 | H01H/83/14 |
| JP | 2-262612 | * 5/1988 | 310/348 |
| JP | 63-110900 | * 5/1988 | 310/348 |

* cited by examiner

*Primary Examiner*—Thomas M. Dougherty
(74) *Attorney, Agent, or Firm*—Oblon, Spivak, McClelland, Maier & Neustadt, P.C.

(57) ABSTRACT

A bistable actuator for residual-current devices, including a lamina having at least one face, a first end, and a second end, and configured to actuate from a first stable position to a second stable position; at least one layer of piezoelectric material provided on the at least one face of the lamina at the first end of the lamina, and configured to stimulate the lamina to shift from the first stable position to the second stable position in response to an electrical activation signal; and a support element including an interlock coupling, and configured to support the first end and the second end of the lamina, wherein the interlock coupling is configured to interlock the first end of the lamina to the support element, and the second end of the lamina is rigidly coupled to the support element in order to keep the lamina in the first stable position.

14 Claims, 5 Drawing Sheets

BISTABLE ACTUATOR

CROSS-REFERENCE TO RELATED APPLICATIONS

This application claims benefit of priority under 35 U.S.C. 119(a) from Italian Application No. M198A002829 filed Dec. 24, 1998, the entire contents of which are incorporated by reference herein.

BACKGROUND OF THE INVENTION

1. Field of the Invention

The present invention relates generally to bistable actuators and more particularly to a low-energy bistable actuator for residual current devices such as for example residual-current circuit breakers. The present invention will be described with particular reference to a residual-current circuit breaker without intending in any way to limit its scope of application.

2. Discussion of the Background

A residual-current circuit breaker is an automatic circuit breaker for AC circuits which opens when the vector sum of the currents in the conductors of the circuit, which is zero in normal conditions, exceeds a preset value.

Residual-current circuit breakers are meant to prevent metallic parts, such as the enclosures of appliances and the metallic masses of the protected area, connected to an earth system apparatus of suitable resistance, from becoming live (indirect protection) and, if sufficiently sensitive and fast-acting, can in certain conditions also provide protection against contact with normally live parts (direct protection).

The main characteristic of residual-current circuit breakers is that they achieve extremely short circuit opening and closure times.

A residual-current circuit breaker is shown generically in FIG. 1. The circuit breaker comprises a sensor 4 for detecting the residual fault current, generally constituted by a magnetic core through which the neutral 2 and the phase 3 pass and are then input connected to a load (not shown), and by a secondary winding 10 across which a voltage is generated when the fault current is present. An electronic coupling circuit 5, which is supplied by the voltage generated across the secondary winding, is provided between the current sensor 4 and an actuator 6.

The residual-current circuit breaker further comprises a release or disengagement mechanism 7 which is actuated by the actuator 6 and opens the contacts 8 and 9 if there is an earth fault current.

Conventional actuators used in residual-current circuit breakers are of the electromagnetic type, e.g. electromagnetic relays of the demagnetization type, and have the following drawbacks. They are sensitive to magnetic fields which consequently alter their operation. For example, the presence of an electromagnetic field can cause an unwanted and unwarranted actuation of the actuator, or an external magnetic field can alter the magnetization of the electromagnetic relay, consequently altering the sensitivity of the residual-current circuit breaker. These actuators are also sensitive to impacts and vibrations, are mechanically complicated to provide, and are expensive.

SUMMARY OF THE INVENTION

Accordingly, one object of the invention is to provide a bistable actuator for residual-current devices which is insensitive to external magnetic fields.

Another object of the present invention is to provide a bistable actuator for residual-current devices which provides assured intervention with extremely short actuation times.

Another object of the present invention is to provide a bistable actuator for residual-current devices, which requires a low triggering energy, so as to make the actuator applicable in self-powered residual-current circuit breakers wherein the small amount of energy is derived exclusively from the earth fault current.

Yet another object of the present invention is to provide a bistable actuator for residual-current devices which is substantially insensitive to impacts and vibrations.

Still yet another object of the present invention is to provide a bistable actuator for residual-current devices, which is highly reliable, relatively easy to manufacture and at competitive costs.

These objects and others are achieved according to the present invention by providing a novel bistable actuator for residual-current devices including a lamina having at least one face, a first end, and a second end, and configured to actuate from a first stable position to a second stable position; at least one layer of piezoelectric material provided on the at least one face of the lamina at the first end of the lamina, and configured to stimulate the lamina to shift from the first stable position to the second stable position in response to an electrical activation signal; and a support element comprising an interlock coupling, and configured to support the first end and the second end of the lamina, wherein the interlock coupling is configured to interlock the first end of the lamina to the support element, and the second end of the lamina is rigidly coupled to the support element in order to keep the lamina in the first stable position.

BRIEF DESCRIPTION OF THE DRAWINGS

A more complete appreciation of the invention and many of the attendant advantages thereof will readily be obtained as the same becomes understood by reference to the following detailed description when considered in connection with the accompanying drawings, wherein.

DETAILED DESCRIPTION OF THE INVENTION

Figure 1:
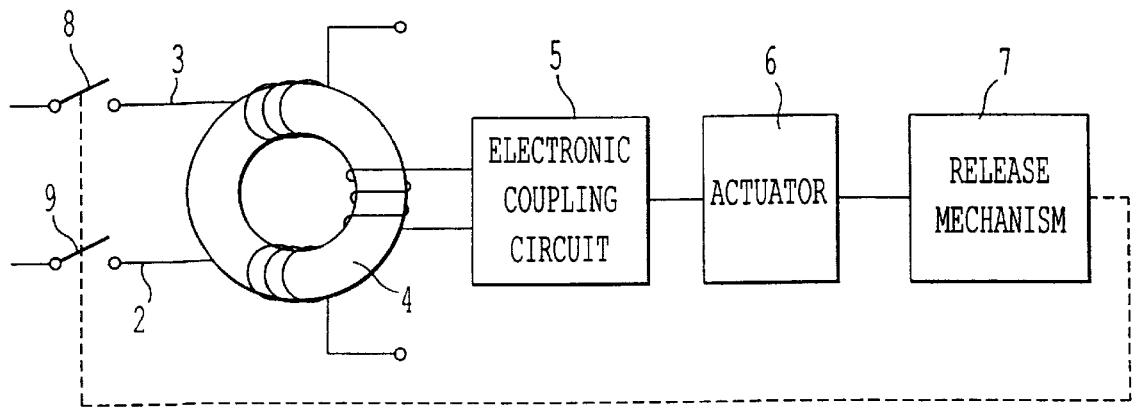
FIG. 1 is a schematic block diagram of a residual-current circuit breaker.
Figure 2:
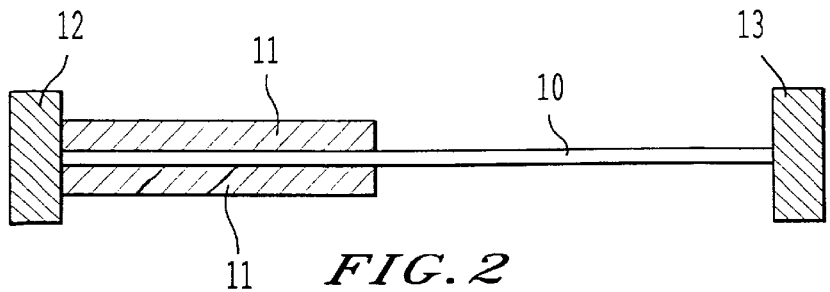
FIG. 2 is a schematic side view of a bistable actuator according to the present invention.
Figure 3:
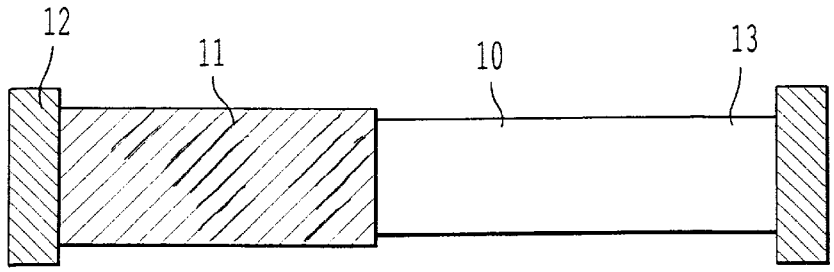
FIG. 3 is a plan view of FIG. 2, illustrating the bistable actuator according to the present invention.

Referring now to the drawings, wherein like reference numerals designate identical or corresponding parts throughout the several views, and more particularly to FIG. 2, a bistable actuator is illustrated including a metallic lamina 10, which has a substantially rectangular shape. At least one layer of piezoelectric material 11 is applied on at least one face of the lamina and on at least one portion thereof. In a preferred embodiment, the layer of piezoelectric material 11 is fixed in correspondence to a first end of the lamina 10. The first end of the metallic lamina 10, on which the layer of piezoelectric material 11 is arranged, is inserted with an interlock coupling 18 in a supporting element 12. A second end of the lamina, which is opposite to the first end, is rigidly coupled to a supporting element 13 so as to prevent any movement of the rigidly coupled ends of the lamina 10. In this configuration, the lamina 10 is positioned in a first stable equilibrium position, as shown by dashed lines in FIG. 13.

In a preferred embodiment, the supporting elements 12 and 13 are monolithic. Alternatively, they can be provided by two separate different elements. Preferably, two layers 11 of piezoelectric material are arranged on opposite surfaces of the lamina at the first end. These layers are positioned substantially parallel to each other in a bimorph configuration with the metallic lamina 10 interposed between them. Alternatively, the piezoelectric layers 11 can be positioned superposed on the same face of the lamina 10.

A portion of the piezoelectric layers 11 is inserted with an interlock coupling 18, together with the lamina 10, in the supporting element 12. Thus, the actuator has a rigid coupling in which the piezoelectric elements 11 behave like a pivot and thus can transfer in an optimum manner the bending moment to the free part of the lamina 10, i.e. the portion of the lamina 10 which is comprised between the first end which is associated with the piezoelectric layers 11 and the second end which is coupled to the supporting structure.

The operation of the bistable actuator according to the invention is as follows. The lamina 10 is subjected to an axial compressing stress and thus assumes the deformed configuration shown by dashed lines in FIG. 13. The deformation (i.e., deflection) of the lamina 10 at the free tip of the piezoelectric layers 11 is much smaller than the deformation at the free part of the lamina. This occurs because the piezoelectric part 11 is much more rigid than the free part of the lamina 10. In the presence of an earth fault current, an electrical activation signal for the piezoelectric layers is produced, causing deformation at both points of the lamina. The portion of metallic lamina 10 on which the piezoelectric elements 11 are fixed flexes. The deflection at the end of the piezoelectric elements 11 that is not inserted with an interlock coupling reduces and moves beyond the imaginary dashed line of the non-deformed configuration. In this manner, the lamina 10 becomes unstable and abruptly shifts, producing actuation, to a second stable position as shown as solid lines in FIG. 13. This actuation entails, for example, the actuation of a pin 14 to which the release device of a residual-current circuit breaker is connected.

It should be noted that the end of the lamina 10, on which the layers of piezoelectric material 11 are arranged, is inserted with an interlock coupling 18 in the supporting element in order to maximize the stability of the actuator and the magnitude of flex of the piezoelectric elements at the end that is not inserted in the supporting element.

The bistable actuator according to the invention, thanks to the use of piezoelectric material, is inherently immune to magnetic fields. Moreover, the piezoelectric layers 11 are glued to the lamina 10. This configuration ensures a highly compact structure which is mechanically simple to provide. Accordingly, bistable actuators according to the present invention can be provided at a cost reduction with respect to conventional actuators.

The structure of the actuator thus conceived is also bistable. Consequently, the actuator has a low snap action energy which makes the actuator applicable in self-powered residual-current circuit breakers, wherein small amounts of available energy are derived exclusively from the earth fault current.

Figure 13:
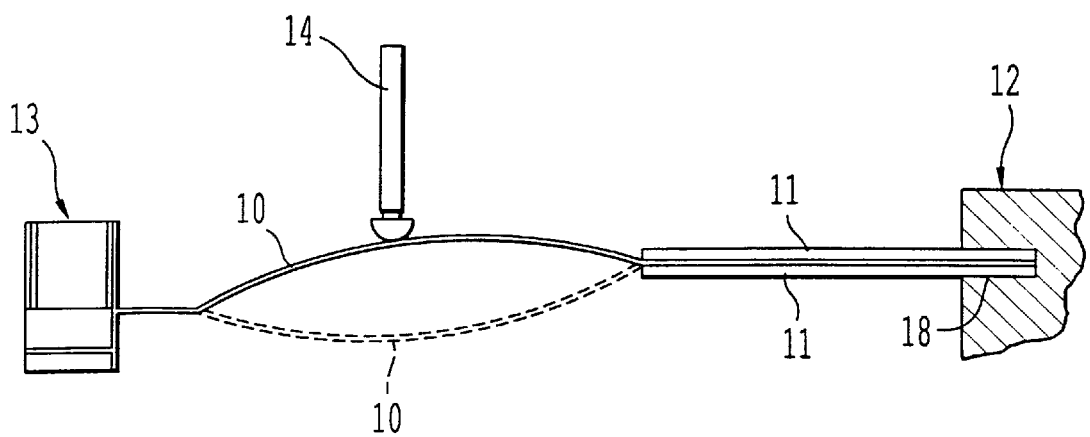
FIG. 13 is a view of the actuator according to the invention, positioned in a preferred configuration.

Moreover, in a particularly preferred embodiment as shown in FIG. 13, the ends of the lamina 10 are coupled to the supporting structure 12 in mutually staggered positions with reference to a median plane of the lamina in a non-deformed configuration. This configuration facilitates a reduction in the energy required to make the lamina snap from one configuration to the other.

The lamina 10 can advantageously be made of superelastic material to ensure that for an equally provided stroke and force, a lower snap-action energy is required. This choice of material becomes necessary when the length of the actuator decreases below a certain value. In addition to being made of superelastic or pseudoelastic material, the lamina 10 can also be made of linear superelastic material.

Despite its bistable nature, the actuator according to the invention can in any case be rendered sufficiently insensitive to impacts and vibrations by means of appropriate shapes or local reductions in the thickness of the lamina 10 as shown in detail in FIGS. 4 to 12. Since in a residual-current circuit breaker, especially of the self-powered type, there is a very small amount of energy available to provide the actuation of the actuator yet rapid intervention times are required, it is therefore necessary for the bistable lamina 10 to meet certain requirements in terms of rigidity, mass and dimensions.

Figure 4:
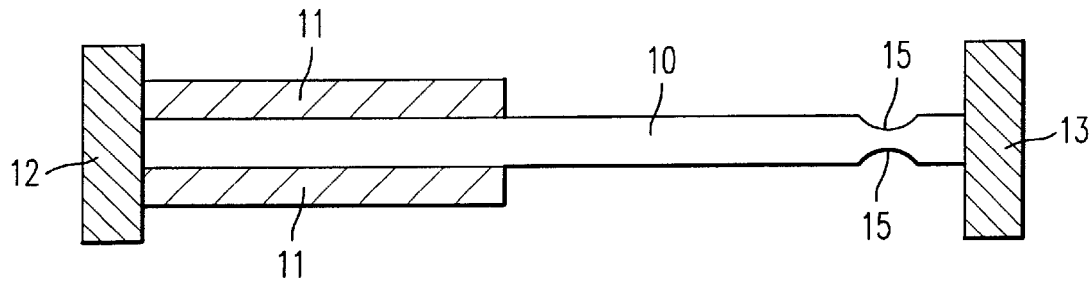
FIG. 4 is a view of a second embodiment of the bistable actuator according to the present invention.
Figure 5:
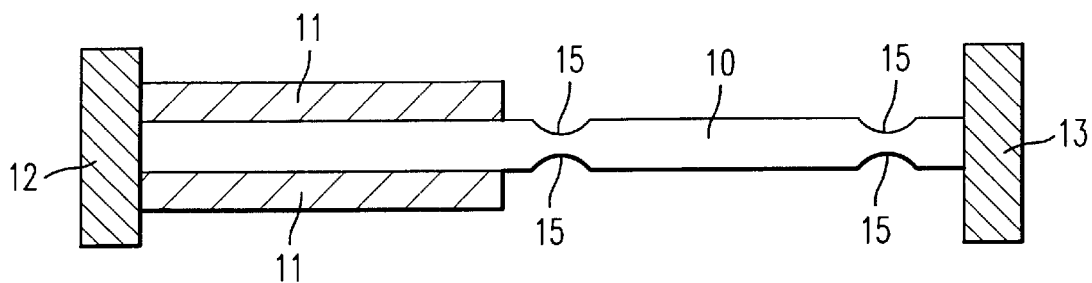
FIG. 5 is a view of a third embodiment of the bistable actuator according to the present invention.

In view of the above, it is therefore necessary to minimize the driving energy of the actuator in order to increase its mechanical stability and optimize its force-displacement characteristic. To that end, at least a portion of the lamina 10 proximate to the second end which is rigidly coupled to the supporting element 13 is shaped, so as to provide functional hinges. In particular, this shaped portion can be provided so as to decrease in width and thickness. As shown in FIG. 4 and in FIG. 5, it is possible to provide a thickness reduction of the cross-section of the lamina 10, in an area designated by the reference numeral 15. The thickness reduction can be provided only in a portion of the metallic lamina 10 proximate to the second end, or also in a region of the lamina which is adjacent to the piezoelectric layers 11.

Figure 6:
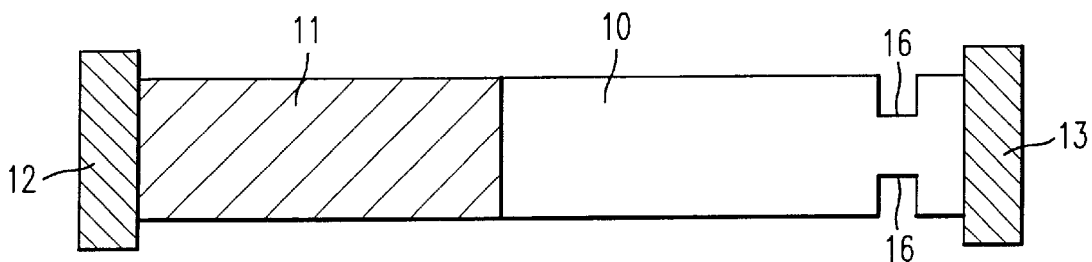
FIG. 6 is a view of a fourth embodiment of the bistable actuator according to the present invention.
Figure 7:
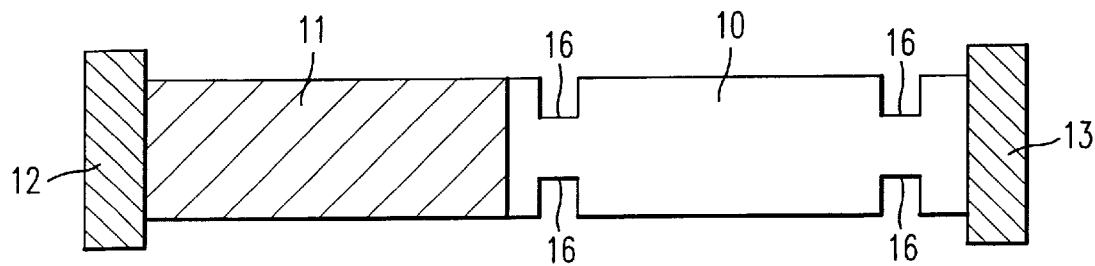
FIG. 7 is a view of a fifth embodiment of the bistable actuator according to the present invention.
Figure 8:
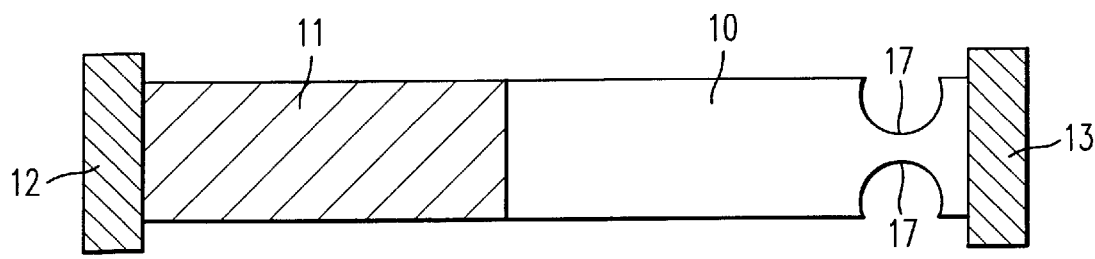
FIG. 8 is a view of a sixth embodiment of the bistable actuator according to the invention.
Figure 9:
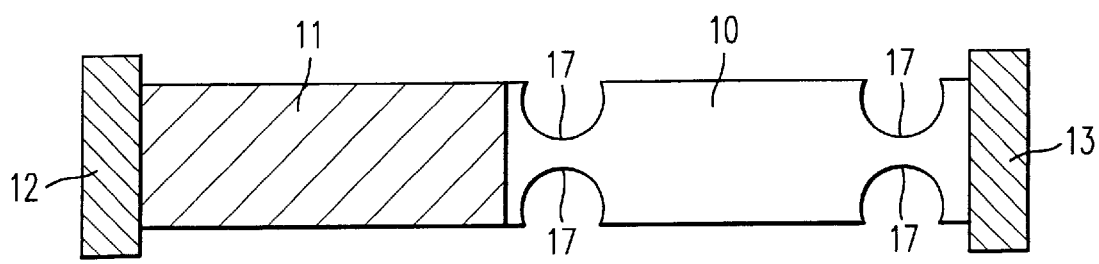
FIG. 9 is a view of a seventh embodiment of the bistable actuator according to the invention.

With reference to FIGS. 6–12, other embodiments of the actuator according to the invention are illustrated, wherein the metallic lamina 10 is shaped in order to present at least one portion with a reduced width. In particular, the reduction of width of the lamina 10 can be provided by suitably shaped recesses 16. These recesses can be provide only at portions of the lamina 10 which are adjacent to the second end, as shown in FIG. 6, or at portions which are adjacent to the piezoelectric layers 11, as shown in FIG. 7. Preferably, two recesses 16 are provided for each respective portion. The recesses 16 can have, for example, a square profile as illustrated in FIGS. 6 and 7, or a rounded profile, as shown in FIGS. 8 and 9.

Figure 10:
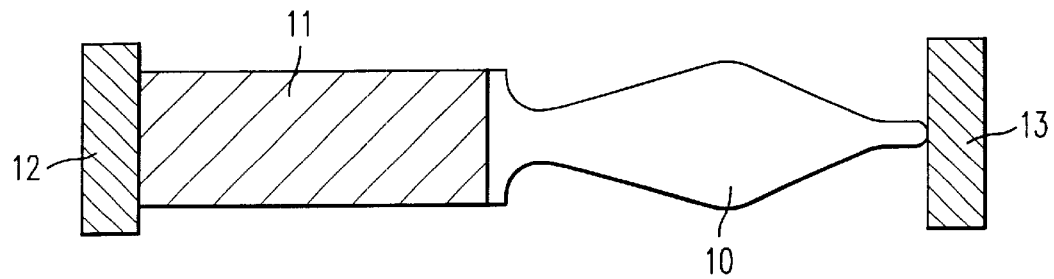
FIG. 10 is a view of an eighth embodiment of the bistable actuator according to the invention.
Figure 11:
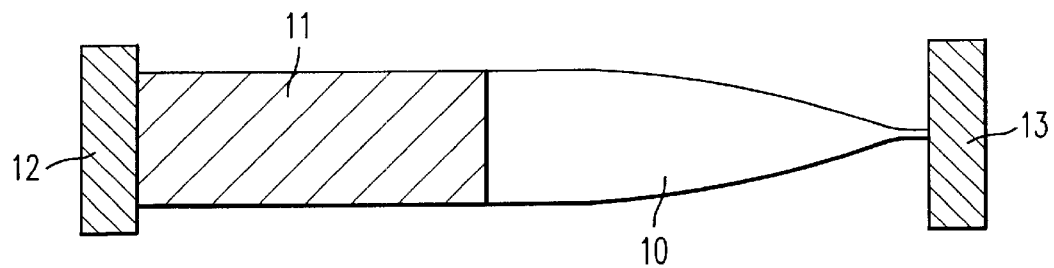
FIG. 11 is a view of a ninth embodiment of the actuator according to the invention.
Figure 12:
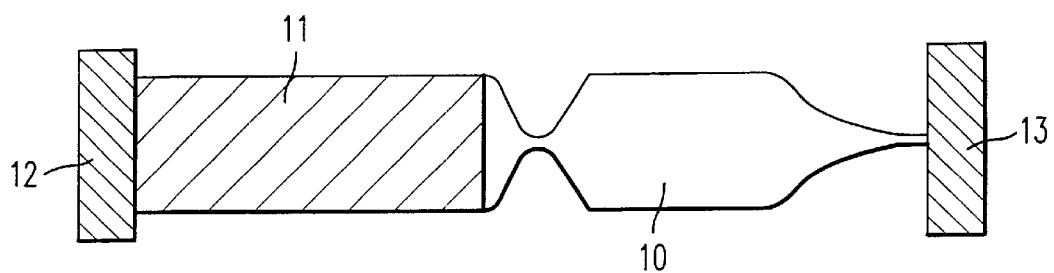
FIG. 12 is a view of a tenth embodiment of the bistable actuator according to the present invention.

FIGS. 10, 11, and 12 are views of further embodiments of the actuator according to the invention, wherein at least one portion of the lamina 10 is shaped so as to have a reduced width. In particular, as shown in FIG. 11, the lamina 10 has a portion, which is adjacent to the second end, with a tapered profile. Alternatively, the portion of the lamina 10 that is adjacent to the region where the piezoelectric layer or layers 11 are arranged can be shaped so as to have a tapered profile, as illustrated in FIGS. 10 and 12.

In the presence of an earth fault current, if the actuator is used in a residual-current circuit breaker, an electrical activation signal for the piezoelectric elements would be produced causing the piezoelectric elements to be deformed. The portion of metallic lamina on which the piezoelectric elements are glued would flex. The flexing causes the free part of the lamina to snap to a second stable position. The arrangement of the ends of the metallic lamina 10 at different levels enables a reduction in the required actuation energy.

The actuator according to the present invention can be advantageously used in various kind of devices. In particular, it can be used in a residual-current circuit breaker as previously described, or in a residual-current block, i.e. a block which is generally coupled to a thermomagnetic circuit breaker. Alternatively, it can be used in other types of circuit breaker or interruption devices.

Obviously, numerous additional modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A bistable actuator comprising:
    a lamina having at least one face, a first end, and a second end, and configured to actuate from a first stable position to a second stable position;
    at least one layer of piezoelectric material provided on said at least one face of said lamina at said first end of said lamina, and configured to stimulate said lamina to shift from said first stable position to said second stable position in response to an electrical activation signal; and
    a support element comprising an interlock coupling, and configured to support said first end and said second end of said lamina, wherein said interlock coupling is configured to interlock said first end of said lamina to said support element, and said second end of said lamina is rigidly coupled to said support element in order to keep said lamina in said first stable position;
    wherein said support element is configured to support the first end and the second end of said lamina in mutually staggered positions with reference to a median plane of the lamina in a non-deformed configuration in order to reduce an amount of energy required to make the lamina actuate from said first stable position to said second stable position.

2. The bistable actuator according to claim 1, wherein said interlocking coupling is configured to interlock said first end of said lamina and at least a portion of said at least one layer of piezoelectric material to said support element.

3. The bistable actuator according to claim 1, wherein said lamina has two faces, and two layers of piezoelectric material fixed to said two faces of said lamina at said first end of said lamina.

4. The bistable actuator according to claim 1, wherein said second end of said lamina has a reduced width relative to said first end.

5. The bistable actuator according to claim 4, wherein said second end of said lamina includes two recesses.

6. The bistable actuator according to claim 1, wherein said lamina is manufactured of metal.

7. The bistable actuator according to claim 1, wherein said first end of said lamina provided with said at least one layer of piezoelectric material has a reduced width relative to said second end.

8. The bistable actuator according to claim 7, wherein said first end of said lamina provided with said at least one layer of piezoelectric material has two recesses.

9. The bistable actuator according to claim 1, wherein said second end of said lamina has a tapered profile.

10. The bistable actuator according to claim 9, wherein said first end of said lamina provided with said at least one layer of piezoelectric material has a tapered profile.

11. The bistable actuator according to claim 1, wherein said second end of said lamina has a thinner transverse cross-section than said first end of said lamina.

12. The bistable actuator according to claim 1, wherein said lamina is manufactured of superelastic or pseudo-elastic material.

13. A residual-current block, comprising:
    a bistable actuator comprising,
    a lamina having at least one face, a first end, and a second end, and configured to actuate from a first stable position to a second stable position,
    at least one layer of piezoelectric material provided on said at least one face of said lamina at said first end of said lamina, and configured to stimulate said lamina to shift from said first stable position to said second stable position in response to an electrical activation signal, and
    a support element comprising an interlock coupling, and configured to support said first end and said second end of said lamina, wherein said interlock coupling is configured to interlock said first end of said lamina to said support element, and said second end of said lamina is rigidly coupled to said support element in order to keep said lamina in said first stable position;
    wherein said support element is configured to support the first end and the second end of said lamina in mutually staggered positions with reference to a median plane of the lamina in a non-deformed configuration in order to reduce an amount of energy required to make the lamina actuate from said first stable position to said second stable position.

14. A residual-current circuit breaker, comprising:
    a bistable actuator, comprising,
    a lamina having at least one face, a first end, and a second end, and configured to actuate from a first stable position to a second stable position,
    at least one layer of piezoelectric material provided on said at least one face of said lamina at said first end of said lamina, and configured to stimulate said lamina to shift from said first stable position to said second stable position in response to an electrical activation signal, and
    a support element comprising an interlock coupling, and configured to support said first end and said second end of said lamina, wherein said interlock coupling is configured to interlock said first end of said lamina to said support element, and said second end of said lamina is rigidly coupled to said support element in order to keep said lamina in said first stable position;
    wherein said support element is configured to support the first end and the second end of said lamina in mutually staggered positions with reference to a median plane of the lamina in a non-deformed configuration in order to reduce an amount of energy required to make the lamina actuate from said first stable position to said second stable position.

* * * * *